United States Patent
Mokuya et al.

[11] Patent Number: 6,107,669
[45] Date of Patent: *Aug. 22, 2000

[54] LOAD ACTUATING SEMICONDUCTOR CIRCUIT HAVING A THERMALLY RESISTIVE MEMBER

[75] Inventors: Hirofumi Mokuya; Mutuo Taniguchi, both of Kariya, Japan

[73] Assignee: Anden Co., Ltd., Japan

[*] Notice: This patent issued on a continued prosecution application filed under 37 CFR 1.53(d), and is subject to the twenty year patent term provisions of 35 U.S.C. 154(a)(2).

[21] Appl. No.: 09/000,851

[22] Filed: Dec. 30, 1997

[30] Foreign Application Priority Data

Jan. 22, 1997 [JP] Japan ................................ 9-009473
Mar. 17, 1997 [JP] Japan ................................ 9-063240

[51] Int. Cl.⁷ .......................................... H01L 23/62
[52] U.S. Cl. ..................... 257/467; 257/108; 361/27
[58] Field of Search .......................... 361/23, 24, 27, 361/37, 25, 26; 257/467, 108

[56] References Cited

U.S. PATENT DOCUMENTS

| | | | |
|---|---|---|---|
| 3,708,720 | 1/1973 | Whitney et al. | 317/41 |
| 4,319,298 | 3/1982 | Davis et al. | 361/24 |
| 4,982,143 | 1/1991 | Gerschner et al. | 361/24 |
| 5,323,287 | 6/1994 | Peter | 361/24 |
| 5,428,493 | 6/1995 | Takeuchi et al. | 361/27 |
| 5,463,874 | 11/1995 | Farr | 361/22 |
| 5,539,601 | 7/1996 | Farag | 361/25 |
| 5,548,464 | 8/1996 | Manning | 361/25 |
| 5,763,929 | 6/1998 | Iwata | 257/467 |

FOREIGN PATENT DOCUMENTS 5-259463 10/1993 Japan .
8-47168 2/1996 Japan .

Primary Examiner—David Hardy
Attorney, Agent, or Firm—Parkhurst & Wendel, L.L.P.

[57] ABSTRACT

An intelligence power device (IPD), having a temperature-sensitive and heat-damage protecting function, is used as a semiconductor relay which controls load current supplied to an electric load. A target sensitive temperature $T_{SD}$ of IPD is determined according to an allowable load current value, using an equation $T_{SD}=I^2 \times R_{ON} \times R_{TEMP}+T_{ROOM}$, where I represents an allowable load current value, $R_{ON}$ represents an on-resistance value of a power MOSFET, $R_{TEMP}$ represents a thermal resistance value of an entire radiation system of IPD, and $T_{ROOM}$ represents an ambient temperature of IPD. When the load current exceeds the allowable load current value, IPD stops the load current so that the load circuit can be prevented from being subjected to excessively large current.

16 Claims, 4 Drawing Sheets

LOAD ACTUATING SEMICONDUCTOR CIRCUIT HAVING A THERMALLY RESISTIVE MEMBER

BACKGROUND OF THE INVENTION

This invention relates to a load actuating circuit incorporating a semiconductor circuit which actuates an electric load.

In conventional automotive vehicles, semiconductor relays (e.g., power MOSFET) are widely used to actuate various electric loads including a lighting system and a motor driving system. In such a conventional load actuating circuit, a fuse is generally inserted in series with the power MOSFET to prevent the load circuit from being subjected to excessively large current due to short circuit of the wire harness or dead short in the load.

However, recent trends of automotive vehicles are compactness and light weight. Thus, it is preferable to eliminate the fuse for realizing downsizing and weight reduction. To realize this, a load circuit, comprising a load and associated wire harness, needs to be protected against excessive current without using any fuse. For example, a current-detecting resistance may be connected to the power MOSFET which actuates the load. This current-detecting resistance causes a voltage reduction when current flows across the load. Thus, an actual load current value is detected from the voltage reduction caused by the current-detecting resistance. When the load current is increased excessively, the load current is stopped or reduced adequately so as not to exceed a predetermined value (refer to Unexamined Japanese Patent Application No. 8-47168 published in 1996).

However, according to the above-described arrangement, there is a necessity of specially providing the current-detecting resistance. Furthermore, a control circuit is additionally provided to control the power MOSFET in accordance with the detected load current so that the load circuit is protected against excessive current.

SUMMARY OF THE INVENTION

An object of the present invention is to solve the above-described problems. More specifically, an object of the present invention is to provide a fuse-less circuit arrangement which is capable of protecting the load circuit against excessive current without detecting a load current.

In order to accomplish above-described and other related objects, a first aspect of the present invention provides a novel and excellent load actuation circuit comprising a semiconductor relay (10) which controls load current supplied to a load (2). The semiconductor relay (10) has a current shutoff function working at a predetermined sensitive temperature ($T_{SD}$) at which the load current supplied to the load (2) is stopped. Thus, the semiconductor relay (10) acts as a heat-damage protecting device.

Preferably, the sensitive temperature is set somewhere in a temperature range of 70° C. to 140° C.

Preferably, the sensitive temperature is set to a value corresponding to a predetermined allowable load current value.

Preferably, the semiconductor relay (10) comprises an adjusting device (13a) which is used to adjust the sensitive temperature.

Preferably, a thermal resistive member (24) is provided in a heat radiation path for the semiconductor relay (10) to adjust a thermal resistance value ($R_{TEMP}$) of an entire heat radiation system of the semiconductor relay (10).

A second aspect of the present invention provides a manufacturing method for forming a load actuation circuit incorporating a semiconductor relay (10) which controls the load current supplied to a load (2). The manufacturing method comprises the steps of preparing a plurality of semiconductor relays which have various sensitive temperatures, and forming the load actuating circuit by selecting a desirable one of the prepared semiconductor relays which has a desirable sensitive temperature.

A third aspect of the present invention provides a mounting structure for a load actuation circuit. Specifically, a semiconductor relay (10) is electrically connected to and securely fixed on a printed board (21). A radiation plate (26) is provided to release heat from the semiconductor relay (10). And, the thermal resistive member (24) is interposed between the semiconductor relay (10) and the radiation plate (26) so as to adjust the thermal resistance value ($R_{TEMP}$) of the entire heat radiation system of the semiconductor relay (10).

A fourth aspect of the present invention provides a method for adjusting a current-shutoff level for a load actuating circuit, comprising the steps of incorporating a semiconductor relay (10) in a load actuating circuit for controlling the load current supplied to a load (2), providing the thermal resistive member (24) in the heat radiation path for the semiconductor relay (10), and adjusting the thermal resistance value of the thermal resistive member (24) to set a current-shutoff level at which the load current supplied to the load is stopped.

Preferably, the thermal resistive member (24) is a solder used when the semiconductor relay (10) is soldered on a printed board (21), and a soldering area is adjusted to set the current-shutoff level.

Reference numerals in parentheses show the correspondence to the components disclosed in preferred embodiments of the present invention described later. The reference numerals are thus merely used for the purpose of expediting the understanding to the present invention and not used for narrowly interpreting the scope of the present invention.

BRIEF DESCRIPTION OF THE DRAWINGS

The above and other objects, features and advantages of the present invention will become more apparent from the following detailed description which is to be read in conjunction with the accompanying drawings, in which.

DESCRIPTION OF THE PREFERRED EMBODIMENTS

Figure 1:
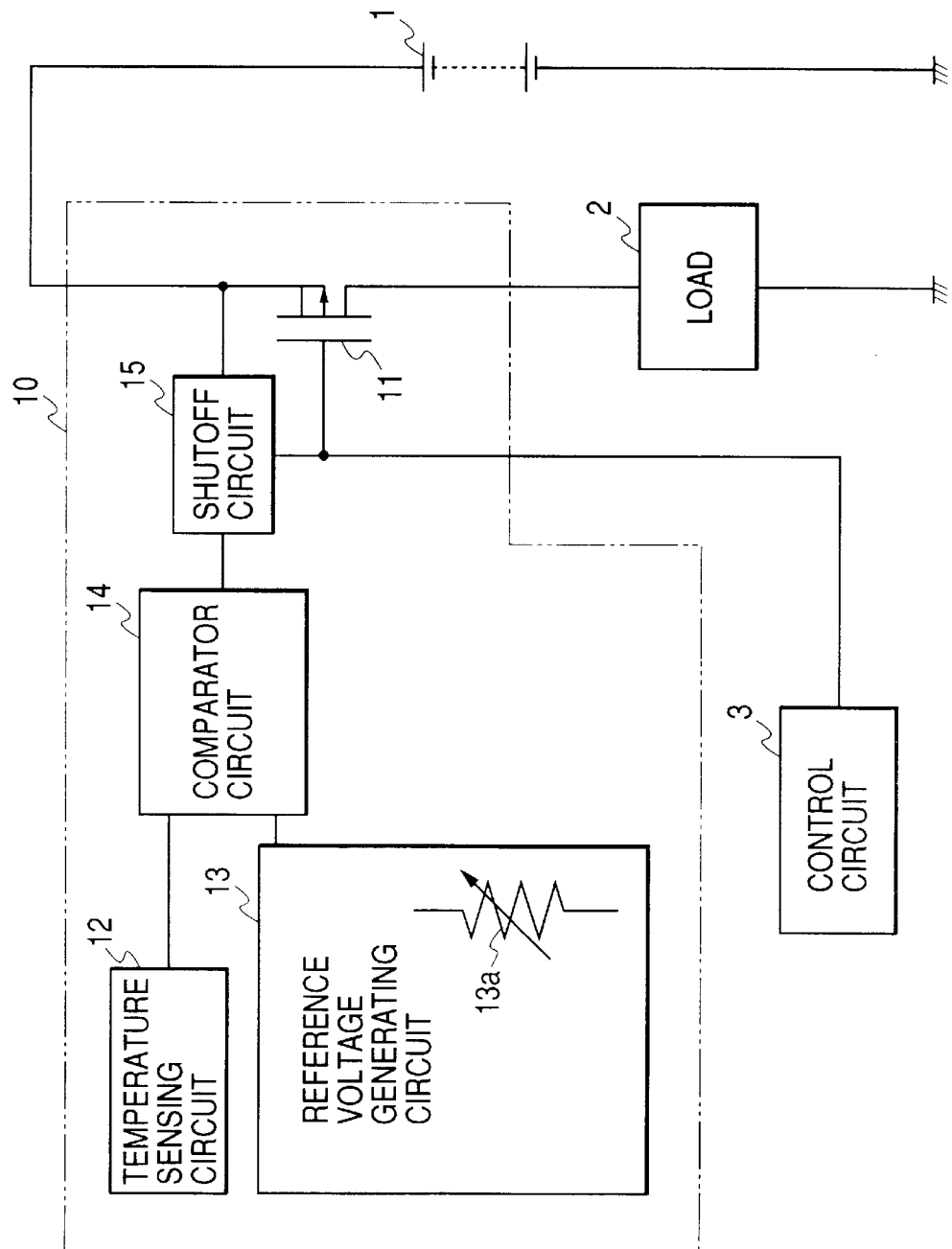
FIG. 1 is a circuit diagram showing a load actuation circuit for an automotive vehicle in accordance with a first embodiment of the present invention.

Preferred embodiments of the present invention will be explained hereinafter with reference to accompanied drawings. Identical parts are denoted by the same reference numerals throughout the drawings.

FIG. 1 is a circuit diagram showing a load actuation circuit for an automotive vehicle in accordance with a first embodiment of the present invention. A battery 1 is mounted on an automotive vehicle body (not shown) to supply electric power to an electric load 2, such as a lighting system and/or a motor driving system, equipped in an automotive vehicle. An intelligent power device (abbreviated IPD, hereinafter) 10 is connected or interposed between the battery 1 and the load 2. IPD 10 functions as a semiconductor relay that actuates the load 2, so as to realize a fuse-less load actuation.

The IPD 10 comprises a P-channel power MOSFET 11 serially connected to the load 2. MOSFET 11 has a base terminal connected to a control circuit 3. The control circuit 3 sends a control signal to the base terminal of MOSFET 11 to control the load current of the load 2. The IPD 10, functioning as a temperature-sensible and heat-damage protecting device, deactivates the power MOSFET 11 when a sensed temperature exceeds a predetermined level. More specifically, IPD 10 comprises a temperature sensing circuit 12, a reference voltage generating circuit 13, a comparator circuit 14, and a shutoff circuit 15. The temperature sensing circuit 12 detects a junction temperature and generates a voltage signal representing the detected junction temperature. For example, the temperature sensing circuit 12 includes a diode whose output voltage varies in response to the detected junction temperature. The reference voltage generating circuit 13 generates a reference voltage. The comparator circuit 14 has an input terminal connected to the temperature sensing circuit 12 and the other input terminal connected to the reference voltage generating circuit 13. The comparator circuit 14 compares the output voltage generated from the temperature sensing circuit 12 with the reference voltage generated from the reference voltage generating circuit 13. The comparator circuit 14 has an output terminal which generates an output signal representing a comparison result. The shutoff circuit 15 is connected to the output terminal of the comparator circuit 14 to turn off the power MOSFET 11 in response to the comparison result obtained by the comparator circuit 14. The above-described components 11 to 15 of IPD 10 are integrated or united into a semiconductor package.

When the temperature of IPD 10 increases and reaches its sensitive temperature, the output voltage of the temperature sensing circuit 12 exceeds the reference voltage of the reference voltage generating circuit 13. In response to the reversal of comparison result, the voltage level of the output signal is changed and sent from the comparator circuit 14 to the shutoff circuit 15. Thus, the power MOSFET 11 is turned off in response to the reversed output signal of the shutoff circuit 15.

In the above-described circuit arrangement, a consumption power "W" at the power MOSFET 11 is expressed by the following equation (1).

$$W = I^2 \cdot R_{ON} \quad (1)$$

where "I" represents an allowable load current value and "$R_{ON}$" represents an on-resistance value of the power MOSFET 11.

A thermal resistance value $R_{TEMP}$ (° C./W) of an entire heat radiation system of IPD 10 is defined by the following equation (2).

$$R_{TEMP} = (T_{SD} - T_{ROOM})/W \quad (2)$$

where $T_{SD}$ represents a sensitive temperature of IPD 10 and $T_{ROOM}$ represents an ambient temperature (i.e., operation environmental temperature) of IPD 10.

Accordingly, using the above-described equations (1) and (2), the sensitive temperature $T_{SD}$ is expressed by the following equation (3).

$$T_{SD} = I^2 \times R_{ON} \times R_{TEMP} + T_{ROOM} \quad (3)$$

As apparent from the equation (3), the sensitive temperature $T_{SD}$ of IPD 10 is proportional to the square of the allowable load current value "I."

Accordingly, the preferred embodiment of the present invention actively utilizes the temperature-sensible and heat-damage protecting function of IPD 10. In other words, IPD 10 functions as a current shutoff device requiring no fuse. When the load current exceeds the allowable level, the power MOSFET 11 is turned off at a corresponding sensitive temperature. Thus, it becomes possible to prevent the load circuit (including the load 2 and wire harness between IPD 10 and the earth) from being subjected to excessively large current.

Next, practical settings of the sensitive temperature $T_{SD}$ will be explained.

Setting Example 1

The on-resistance value $R_{ON}$ of the power MOSFET 11 is 0.1 Ω. The ambient temperature $T_{ROOM}$ is 75°. The thermal resistance value $R_{TEMP}$ is 10° C./W. The allowable load current I is 3 A. When these values are entered in the equation (3), the sensitive temperature $T_{SD}$ becomes $3^2 \times 0.1 \times 10 + 75 = 84°$ C.

Setting Example 2

The on-resistance value $R_{ON}$ of the power MOSFET 11 is 0.2 Ω. The ambient temperature $T_{ROOM}$ is 75°. The thermal resistance value $R_{TEMP}$ is 10° C./W. The allowable load current I is 5 A. When these values are entered in the equation (3), the sensitive temperature $T_{SD}$ becomes $5^2 \times 0.2 \times 10 + 75 = 125°$ C.

For example, the above-described sensitive temperature $T_{SD}$ can be set by adjusting the reference voltage supplied from the reference voltage generating circuit 13. When the reference voltage is given by using a variable resistance, the sensitive temperature $T_{SD}$ can be set to a desirable value by adjusting its resistance value.

The sensitive temperature $T_{SD}$ of IPD 10 may vary due to manufacturing errors. Thus, the sensitive temperature $T_{SD}$ of IPD 10 of each manufactured IPD is measured. Some IPD samples respectively having different sensitive temperatures are prepared beforehand. Then, a preferable IPD having a desirable sensitive temperature $T_{SD}$ is selected. Thus, the load actuating circuit shown in FIG. 1 is formed.

Furthermore, IPD 10 shown in FIG. 1 comprises an adjusting resistance 13a as one component constituting the reference voltage generating circuit 13. According to this circuit arrangement, the reference voltage is changeable in accordance with a selected dividing point of the adjusting resistance 13a. Thus, the desirable sensitive temperature $T_{SD}$ is obtained by trimming the adjusting resistance 13a.

Figure 2:
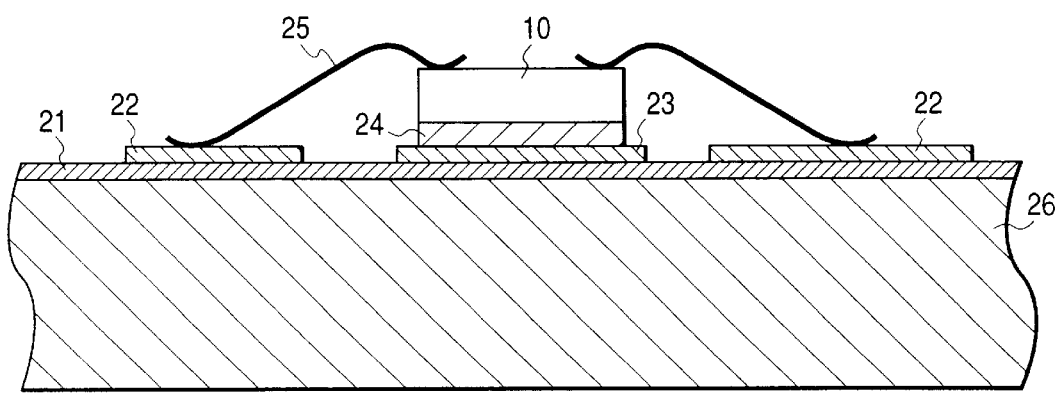
FIG. 2 is a cross-sectional view showing a mounting structure of an intelligent power device incorporated in the load actuation circuit shown in FIG. 1

FIG. 2 shows a detailed mounting structure of IPD 10.

On a printed board 21, bonding pads 22 and a die pad 23 are formed. A thermal resistive member (e.g., metallic member such as molybdenum or 42 alloy, or ceramic such as aluminum nitride, silicone sheet, mica etc.) 24 is provided on the die pad 23. IPD 10 is mounted on the thermal resistive member 24. IPD 10 is bonded to each bonding pad 22 via an aluminum wire 25. An aluminum radiation plate 26 is attached to the bottom surface of the printed board 21.

According to the above-described structure, heat of IPD 10 is released from the radiation plate 26. The thermal resistive member 24 is interposed in the heat radiation path extending from IPD 10 to radiation plate 26. In such an arrangement, the entire heat radiation system of IPD 10 includes the thermal resistive member 24. Thus, the thermal resistance value $R_{TEMP}$ of the entire heat radiation system of IPD 10 is substantially influenced by the thermal resistive member 24. In other words, the sensitive temperature $T_{SD}$ can be set to a desirable value by the thermal resistive member 24.

The thermal resistance value $R_{TEMP}$ can be modified from the equation (3) to the following equation (4).

$$R_{TEMP}=(T_{SD}-T_{ROOM})/R_{ON} \times I^2 \qquad (4)$$

For example, in the above-described setting example 2 of IPD 10 where the allowable load current I is set to 5 A and the sensitive temperature $T_{SD}$ is set to 125° C., there may be a requirement that the allowable load current I needs to be reduced to 2.5 A. In this case, the thermal resistance value $R_{TEMP}$ needs to be increased to $(125-75)/0.2 \times 2.5_2 = 40°$ C./W from the equation (4).

However, according to the preferred embodiment of the present invention, the required thermal resistance value $R_{TEMP}$ of 40° C./W can be realized by interposing the thermal resistive member 24 of 30° C./W between IPD 10 and the die 23 without changing the thermal resistance value of IPD 10 itself.

The thermal resistance value of the thermal resistive member 24 is adjustable in the following manner. A first method is to vary a connecting area (i.e., soldering area) of the thermal resistive member 24. The smaller the connecting area, the larger the thermal resistance value. A second method is to vary the thickness of the thermal resistive member 24. The larger the thickness, the larger the thermal resistance value. The smaller the thickness, the smaller the thermal resistance value. A third method is to vary the material (i.e., coefficient of thermal conductivity) of the thermal resistive member 24.

Furthermore, it is possible to increase the thermal resistance value of IPD 10 by reducing a soldering area of IPD 10. In other words, solder itself can be used as the thermal resistive member 24 of the present invention. This is advantageous in view of cost as well as simplified manufacturing process.

Figure 3:
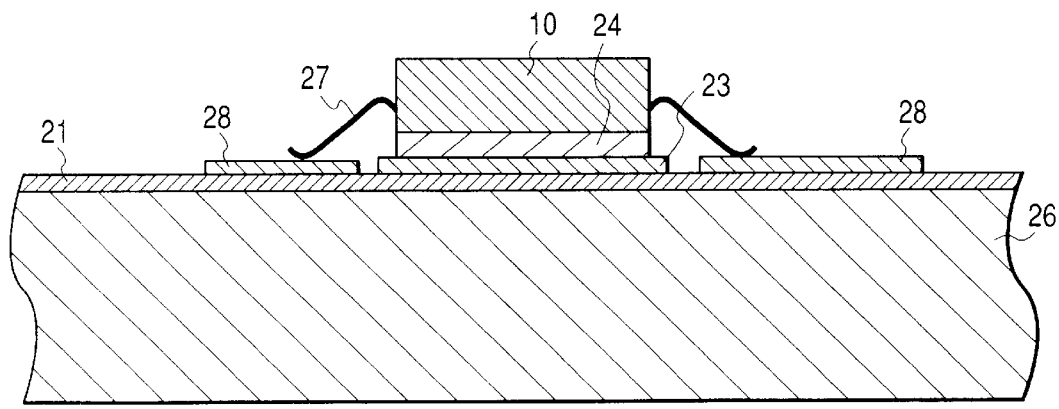
FIG. 3 is a cross-sectional view showing another mounting structure of the intelligent power device incorporated in the load actuation circuit shown in FIG. 1.

IPD 10 can be constituted by a resin-molded semiconductor element shown in FIG. 3. According to the arrangement shown in FIG. 3, IPD 10 is electrically connected to a conductor pattern 28 formed on the printed board 21 by means of a lead 27.

IPD 10 is not limited to a surface mounting type shown in FIG. 2 or 3. For example, IPD 10 can adopt a vertical mounting structure shown in FIG. 4. According to the arrangement of FIG. 4, IPD 10 is a resin-molded semiconductor element which is electrically connected to the printed board 21 via a rigid lead 29. The lead 29 acts as a mechanical support for fixing IPD 10 to the printed board 21. IPD 10 is associated with a metallic radiation plate 30. The thermal resistive member 24 and the aluminum radiation plate 26 are securely fastened together with the metallic radiation plate 30 by a screw bolt 31.

Figure 4:
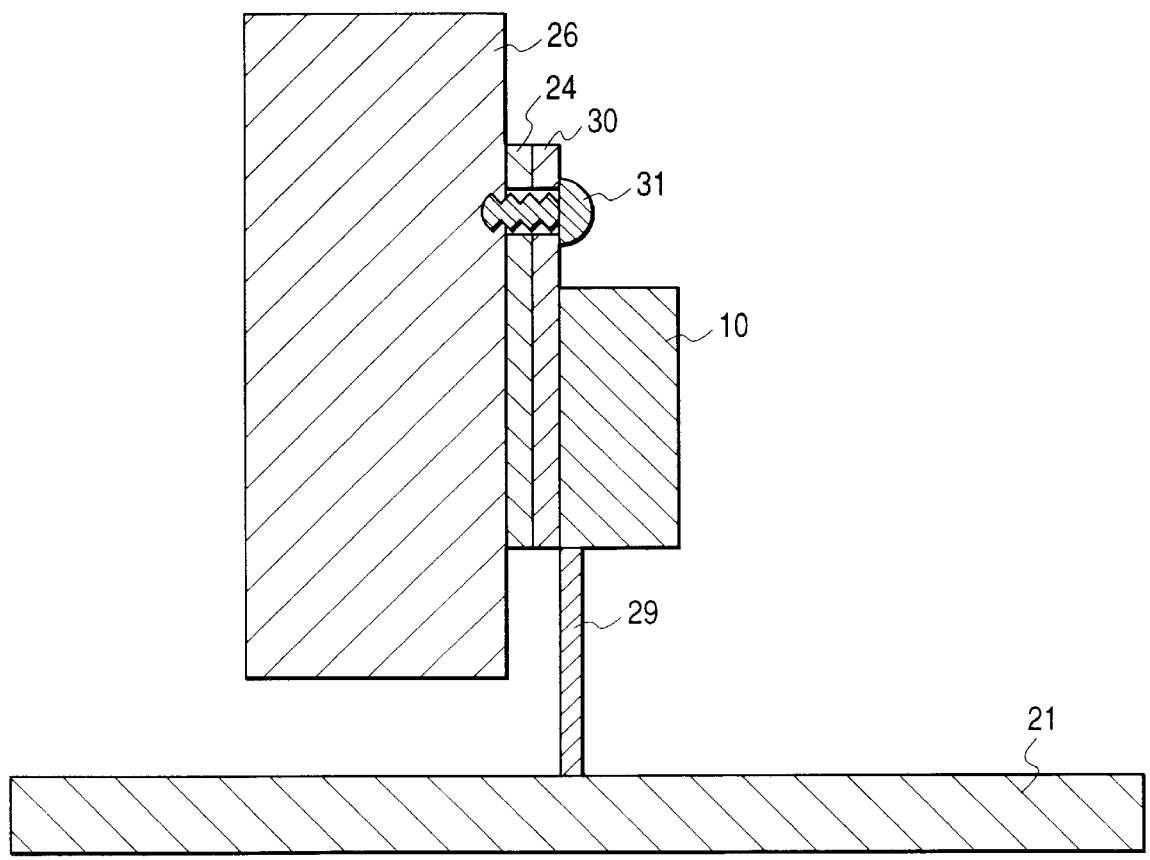
FIG. 4 is a cross-sectional view showing still another mounting structure of the intelligent power device incorporated in the load actuation circuit shown in FIG. 1.

In both of the mounting structures shown in FIGS. 3 and 4, the thermal resistive member 24 is interposed in the heat radiation path extending from IPD 10 to the radiation plate 26. Accordingly, by adjusting the properties of the thermal resistive member 24, the sensitive temperature $T_{SD}$ can be set to a desirable value corresponding to the allowable load current I.

Figure 5:
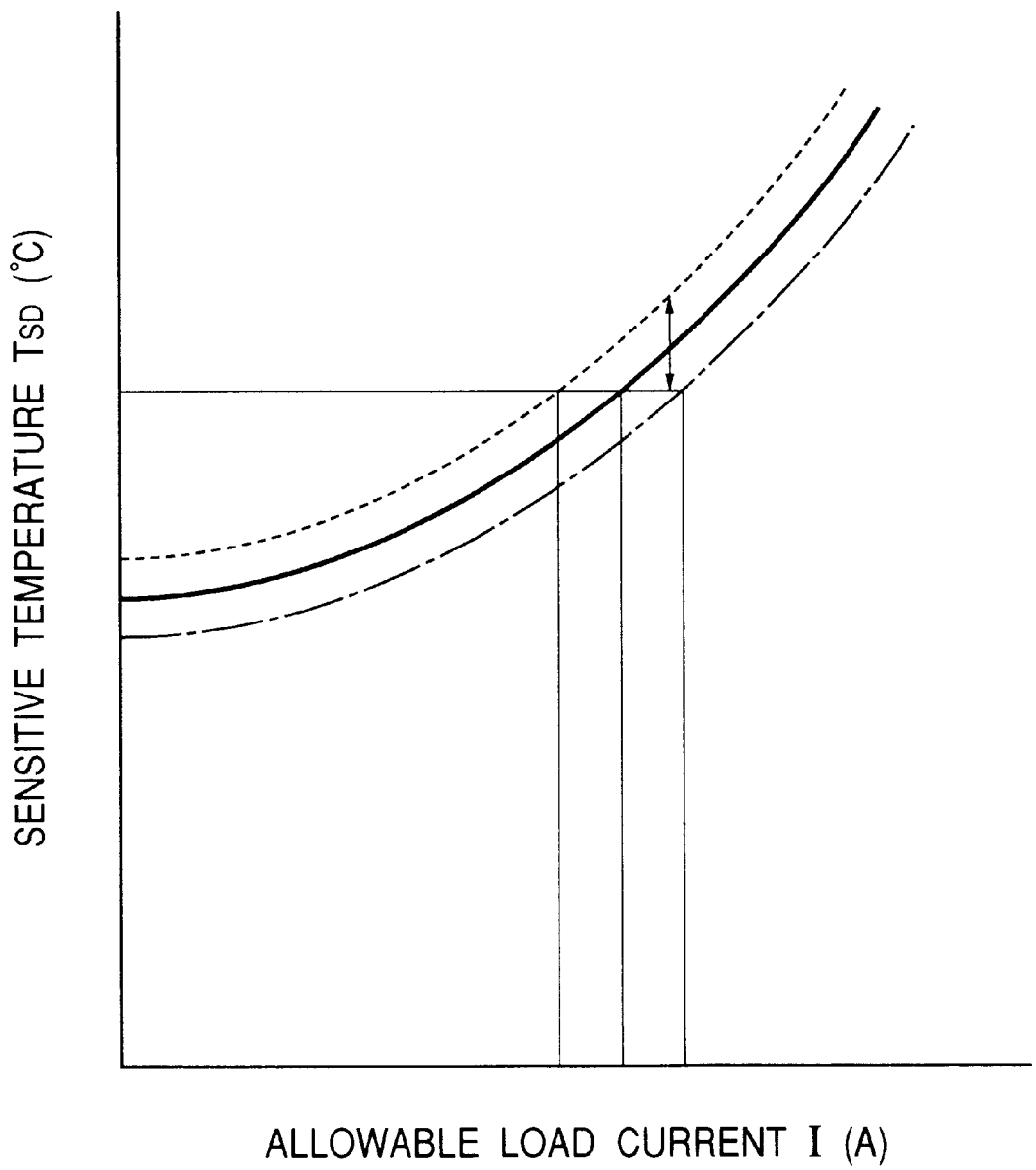
FIG. 5 is a graph showing a relationship between an allowable load current and a sensitive temperature.

FIG. 5 shows a relationship between the allowable load current I and the sensitive temperature $T_{SD}$ derived from the above-described equation (3). In FIG. 5, a solid curve represents a case where the ambient temperature $T_{ROOM}$ is set to 70° C., the thermal resistance value $R_{TEMP}$ is set to 10 ° C./W, and the on-resistance value $R_{ON}$ of the power MOSFET 11 is set to 0.2 Ω.

When the ambient temperature $T_{ROOM}$ is larger than 70° C., the curve representing the relationship between the allowable load current I and the sensitive temperature $T_{SD}$ shifts upward in FIG. 5 as shown by a dotted line. When the ambient temperature $T_{ROOM}$ is lower than 70° C., the curve representing the relationship between the allowable load current I and the sensitive temperature $T_{SD}$ shifts downward in FIG. 5 as shown by an alternate long and short dash line.

Accordingly, the temperature-sensible and heat-damage protecting function of IPD 10 is effected at a lower load current when the ambient temperature $T_{ROOM}$ is higher than a predetermined sensitive temperature $T_{SD}$. Accordingly, in an actual load actuating circuit, IPD 10 is located at a place where the circuit component is subjected to a severe heat environment. When an actual ambient temperature $T_{ROOM}$ exceeds the predetermined sensitive temperature $T_{SD}$, the heat-damage protecting function of IPD 10 is effected at a load current lower than a predetermined set value. Thus, it becomes possible to provide a safe and reliable load actuating circuit which is capable of surely protecting the circuit components from any heat damages.

The load actuating circuit of the above-described embodiments can be applied to any public welfare devices as well as automotive vehicles. In this case, it is preferable that the sensitive temperature is set in a range of 70° C. to 140° C. considering their operating conditions. Thus, IPD 10 can function as a current shutoff device working at a desirable sensitive temperature. No fuse is required.

When the current shutoff function of IPD 10 is effected at the lower temperature range of 70° C. to 140° C., an ordinary operating temperature of a peripheral circuit element, such as the power MOSFET 11, is adequately suppressed below 140° C. Accordingly, there is no necessity of guaranteeing performance of each circuit element in operation against higher temperatures. Effecting the current shutoff function at a lower temperature range makes it possible to arrange IPD 10 by using a power MOSFET 11 having a smaller on-resistance value. In this case, when a plurality of IPDs 10 are mounted on the same circuit substrate respectively for corresponding plural electric loads, an overall heat generation can be reduced significantly. Thus, thermal design of the entire circuit can be simplified.

According to the above-described embodiment, IPD 10 is disposed adjacent to the electric power terminal with respect to the load 2 so that the load circuit is formed between IPD 10 and the earth. However, it is possible to dispose IPD 10 adjacent to the earth with respect to the load 2 so that the load circuit is formed between IPD 10 and the electric power terminal.

Furthermore, the P-channel power MOSFET 11 disclosed in FIG. 1 can be replaced by an n-channel power MOSFET.

This invention may be embodied in several forms without departing from the spirit of essential characteristics thereof. The present embodiments as described are therefore intended to be only illustrative and not restrictive, since the scope of the invention is defined by the appended claims rather than by the description preceding them. And, all changes that fall within the metes and bounds of the claims, or equivalents of such metes and bounds, are therefore intended to be embraced by the claims.

What is claimed is:

1. A load actuating circuit comprising:

a semiconductor relay that controls a load current supplied to a load;

said semiconductor relay having a current shutoff function working at a predetermined sensitive temperature ($T_{SD}$) at which supply of said load current to said load is stopped, thereby acting as a heat-damage protecting device; and a thermally resistive member interposed between said semiconductor relay and a heat radiation member to adjust a thermal resistive value ($R_{TEMP}$) of an entire heat radiation system of said semiconductor relay by setting a thermal resistive value of said thermally resistive member, thereby setting a shutoff current value of said semiconductor relay.

2. The load actuation circuit according to claim 1, wherein said sensitive temperature is set in a temperature range of 70° C. to 140° C.

3. The load actuation circuit according to claim 1, wherein said sensitive temperature is set to a value corresponding to a predetermined allowable load current value.

4. The load actuation circuit according to claim 1, wherein said semiconductor relay comprises an adjusting device that is used to adjust said sensitive temperature.

5. The load actuation circuit in accordance with claim 1, wherein said semiconductor relay is on a printed board; and said heat radiation member is a radiation plate attached to a reverse surface of said printed board to release heat from said semiconductor relay.

6. The load actuation circuit in accordance with claim 1, wherein said semiconductor relay is electrically connected to a printed board via a rigid lead; and said heat radiation member is a radiation plate spaced from said printed board and attached to said semiconductor relay via said heat radiative member.

7. A load actuating semiconductor circuit comprising:

a semiconductor package, without a separate thermostat, connected to a load for controlling a load current supplied to said load, said semiconductor package including a temperature sensing circuit, a reference voltage generating circuit, and a shutoff circuit all integrated in said semiconductor package, wherein said temperature sensing circuit is connected to detect a junction temperature and to generate an output voltage representing a detected function temperature;

said reference voltage generating circuit is connected to generate a reference voltage corresponding to a predetermined sensitive temperature, said shutoff circuit is connected to stop supply of said load current to said load based on a comparison between said output voltage and said reference voltage, wherein said reference voltage generating circuit comprises an adjusting device for adjusting said sensitive temperature.

8. The load actuating semiconductor circuit in accordance with claim 7, wherein said sensitive temperature is set in a temperature range of 70° C. to 140° C.

9. The load actuating semiconductor circuit in accordance with claim 7, wherein said sensitive temperature is set to a value corresponding to a predetermined allowable load current value.

10. A load actuation circuit comprising:

a semiconductor relay connected between a power supply and a load for controlling supply of load current to said load;

a heat radiation member releasing heat from said semiconductor relay; and a thermally resistive member serving as a heat radiation path between said semiconductor relay and said heat radiation member so that said thermally resistive member is included in an entire heat radiation system of said semiconductor relay;

wherein a thermal resistive value of the entire heat radiation system of said semiconductor relay is substantially controlled by dimensions and material properties of said thermally resistive member, thereby setting a shutoff current value of said semiconductor relay.

11. The load actuation circuit in accordance with claim 10, wherein said semiconductor relay is on a printed board; and said heat radiation member is a radiation plate attached to a reverse surface of said printed board.

12. The load actuation circuit in accordance with claim 10, wherein said semiconductor relay is electrically connected to a printed board via a rigid lead; and said heat radiation member is a radiation plate spaced from said printed board and fastened to said semiconductor relay via said heat radiative member.

13. The load actuation circuit in accordance with claim 10, wherein said semiconductor relay stops the supply of said load current at a predetermined sensitive temperature.

14. The load actuation circuit in accordance with claim 13, wherein said sensitive temperature is in a range of 70° C. to 140° C.

15. The load actuation circuit in accordance with claim 13, wherein said sensitive temperature corresponds to a predetermined allowable load current value.

16. The load actuation circuit in accordance with claim 13, wherein said semiconductor relay comprises a device for adjusting said sensitive temperature.

* * * * *